United States Patent [19]

Kuo

[11] 4,035,662
[45] July 12, 1977

[54] CAPACITIVE MEANS FOR CONTROLLING THRESHOLD VOLTAGES IN INSULATED GATE FIELD EFFECT TRANSISTOR CIRCUITS

[75] Inventor: Chang - Kiang Kuo, Houston, Tex.

[73] Assignee: Texas Instruments Incorporated, Dallas, Tex.

[21] Appl. No.: 581,006

[22] Filed: May 27, 1975

Related U.S. Application Data

[62] Division of Ser. No. 85,879, Nov. 2, 1970, abandoned.

[51] Int. Cl.² .............. H03K 19/08; G11C 19/28; H03K 17/04; H03K 17/60
[52] U.S. Cl. .................. 307/205; 307/221 C; 307/251; 307/279; 307/DIG. 4
[58] Field of Search .......... 307/205, 221 C, 221 D, 307/224 C, 251, 279, 304, DIG. 4, DIG. 1

[56] References Cited

U.S. PATENT DOCUMENTS

| 3,480,796 | 11/1969 | Polkinghorn et al. | 307/279 X |
|---|---|---|---|
| 3,524,077 | 8/1970 | Kaufman | 307/221 C X |
| 3,576,447 | 4/1971 | McKenny | 307/221 C |
| 3,579,273 | 5/1971 | Cook | 307/221 C |
| 3,601,627 | 8/1971 | Booher | 307/205 |
| 3,639,787 | 2/1972 | Lee | 307/DIG. 1 X |
| 3,765,003 | 10/1973 | Paivinen et al. | 307/304 X |
| Re. 27,305 | 3/1972 | Polkinghorn et al. | 307/251 |

OTHER PUBLICATIONS

Sonoda, "Charge Redistribution Shift Register Cell;" IBM Tech. Discl. Bull.; vol. 12, No. 12, p. 2079; May, 1970.

*Primary Examiner*—John S. Heyman
*Assistant Examiner*—Larry N. Anagnos
*Attorney, Agent, or Firm*—Harold Levine; Rene E. Grossman; Richard P. Berg

[57] ABSTRACT

Circuit means for eliminating the effect of excessive threshold voltages in insulated gate field effect transistor inverter-type circuits utilizes capacitor pull-up. Capacitors are selectively coupled from various phased voltage outputs of a multi-phase voltage supply to the driver-gate of various field effect transistors to provide increased voltage during voltage pulses of the phase involved. A voltage between the threshold voltage and a required minimum noise margin is thereby added to the driver-gate input signal to overcome the threshold voltage effect. This circuit means is particularly useful in dynamic circuits such as multiphase shift registers and bipolar-to-high voltage field effect transistor coupled circuits.

3 Claims, 15 Drawing Figures

INVENTOR
Chang-Kiang Kuo

BY
ATTORNEY

WITNESS

CAPACITIVE MEANS FOR CONTROLLING THRESHOLD VOLTAGES IN INSULATED GATE FIELD EFFECT TRANSISTOR CIRCUITS

This is a division of application Ser. No. 85,879, filed Nov. 2, 1970 and now abandoned.

This invention relates to insulated gate field effect transistor integrated inverter circuits, and more particularly to such circuits employing capacitive pull-up means for eliminating the effect of excessive threshold voltages to the gate of the inverter's driver transistor. An inverter is a circuit which has a load device applying a signal to the input of a driver.

A dynamic circuit is one which continuously sequentially transfers data, ordinarily in binary voltage level form, from one cell of the circuit to another, without actually storing the data in any cell, such as a dynamic shift register for example. A multi-phase circuit is one in which data is ordinarily transferred out of a device or cell during a clock pulse from one phase and then into another device or cell during a clock pulse from another phase.

Threshold voltages of insulated gate field effect transistors provide digital circuits with an effective barrier between binary data of "0" and "1" voltage levels. However, any threshold voltage higher than the necessary minimum noise margin produces a circuit of lower speed, higher power dissipation and/or larger circuit size when fabricated as a semiconductor integrated circuit. The effect of excessive threshold voltage which must be overcome is especially critical to high threshold device circuits and to internal portions of integrated circuits where the drive voltage and required noise margin are low. Overcoming the threshold voltage is also important in interfacing the output of a bipolar transistor to the gate of a high voltage field effect transistor. To overcome these problems, capacitive means is provided by the present invention to drive the gates of driver field effect transistors in multiphase circuits.

Multiphase dynamic insulated gate field effect transistor circuits utilizing capacitive pull-up at the drain of the storage unit have been theoretically known to exist. Such circuits offer many potential advantages such as extremely low power dissipation, very high speed operation to transfer data and small cell layout where fabricated as a semiconductor integrated circuit. However, due to certain inherent shortcomings such as minority carrier injection into the semiconductor substrate on which the circuit is fabricated, charge sharing effect between the capacitors and field effect transistors, back charging transient effects due to the finite raise and fall time of the phased clock pulses, and overlap capacitance discharging due to the parasitic capacitive effect between gate and source or gate and drain these have remained theoretical rather than actual operational circuits. These problems are likewise solveable by embodiments of the present invention which provide improved circuit performance by the utilization of additional capacitor pull-up to drive the gate of a field effect transistor in addition to the capacitor pull-up at the drain of the field effect transistor.

It is therefore an object of the present invention to provide circuit means for overcoming the threshold voltages in dynamic insulated gate field effect transistor circuits.

Another object of the invention is to provide circuit means for overcoming the threshold voltage at the driver gate of a field effect transistor when transferring data into such transistor.

A further object of the invention is to provide multiphase dynamic field effect transistor integrated circuits having minimized threshold voltages to overcome in transferring data from one field effect transistor to another.

Still another object of the invention is to provide a very high speed, low power and compact dynamic field effect transistor integrated circuit having drain capacitive pull-up with low minority carrier injection, reduced charge sharing effect, reduced back charging transient and a reduced overlap-capacitive discharge effect.

Still a further object of the invention is to provide means for directly interfacing the output of a bipolar transistor to the input gate of a field effect transistor.

It is yet another object of the invention to provide a high speed low power multi-phase shift register.

These and other objects and advantages are achieved in accordance with the present invention by providing capacitive pull-up circuit means for eliminating the effect of excessive threshold voltages in insulated gate field effect transistor circuits having inverter stages. Essentially, capacitors are selectively coupled from various phased voltage outputs of a multiphase voltage supply to the driver-gate of various field effect transistors to provide an increased surge during phased voltage pulses when transfer of data to particular ones of the transistors is taking place. A voltage between the threshold voltage and required minimum noise margin is thereby added to the driver-gate input signal to overcome the effect of the threshold voltage. Preferred embodiments of the invention have the capacitive means fabricated on a single semiconductor substrate along with the rest of the insulated gate field effect transistor circuit. In one embodiment of the invention, a two or four phase shift register is provided by a circuit employing the capacitive pull-up at each driver-gate transferring data from one cell of the register to the next.

Still further objects and advantages of the invention will be apparent from the detailed decription of various embodiments and the claims and from the accompanying drawings wherein:

Figure 1:
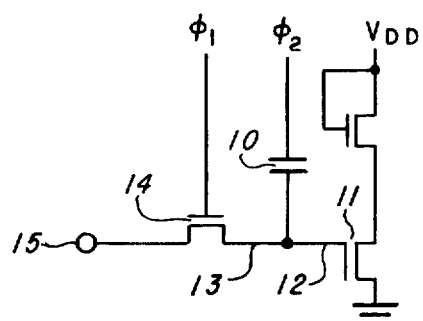
FIG. 1 illustrates generally the capacitive means embodied in the present invention for eliminating the effect of excessive threshold voltages.

Referring then to the drawings, illustrated generally in FIG. 1 is capacitive means 10 which enables circuits embodied in the present invention to eliminate the effect of excessive threshold voltages. Capacitive means 10 is coupled from phased voltage output $\Phi_2$ of a multi-phase voltage supply to driver gate 12 of field effect transistor 11 to provide increased voltage during a voltage pulse from phase $\Phi_2$. The capacitance of means 10 is calculated so that a voltage between the threshold voltage and a required minimum noise margin is added to driver gate 12 at the same time that the pulse of phase $\Phi_2$ is operating transistor 11 to transfer a signal from drain 13. It is important to note that a transfer of data from input 15 through transistor 14 occurs during a voltage pulse from phase $\Phi_1$ and therefore the voltage pulse from phase $\Phi_2$ transfers the data through transistor 11. In a Metal-Insulator-Semiconductor integrated circuit, the capacitive means is fabricated in or on the same semiconductor substrate as the rest of the circuit and is comprised of a semiconductor region, an adherent insulating layer on the semiconductor region and an adherent metal or highly-doped or degenerate semiconductor layer on the insulating layer. $V_{DD}$ is a voltage supply.

Figure 2:
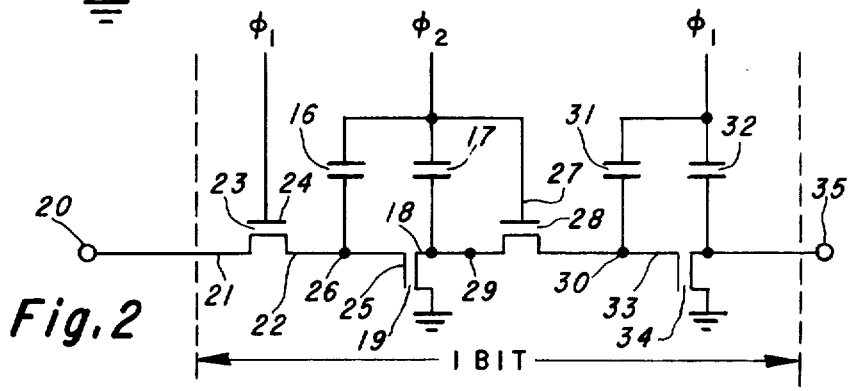
FIG. 2 illustrates a one bit, two phase section of a shift register utilizing the capacitive means of the invention.

The capacitive circuit means of the present invention is particularly useful in multi-phase shift register circuits as illustrated in the embodiment of FIG. 2. The embodiment is a 1-bit section of a 2-phase shift register utilizing both capacitive means 16 of the present invention and capacitive means 17 coupled from drain 18 of field effect transistor 19 and phased voltage output $\Phi_2$ of a multi-phase voltage supply. The circuit operates as follows: a voltage level data signal representing a binary 0 or 1 is applied to input terminal 20 and is transferred from source 21 to drain 22 of transistor 23 when a pulse of phase $\Phi_1$ is applied to gate 24. The 0 voltage level is 0, for example, and the 1 voltage level is −5 to −8 volts. Then, a voltage pulse from phase $\Phi_2$ is applied to capacitive means 16, capacitive means 17 and gate 27 of field effect transistor 28. Capacitive means 16 increases the voltage signal output from field effect transistor 23 at node 26 to turn on gate 25 of transistor 19 and thereby aid in overcoming the threshold voltage of transistor 19. Capacitive means 17 connecting drain 18 of transistor 19 to phased voltage output $\Phi_2$ acts as a load capacitor and couples voltage to drain 18. Simultaneously, the voltage pulse from phase $\Phi_2$ turns on gate 27 of transistor 28 and the data at node 29 is transferred to node 30. A pulse from phased voltage output $\Phi_1$ is also applied to capacitive means 31 and capacitive means 32. Capacitive means 31 is used to increase the voltage output from transistor 28 to overcome the threshold voltage of gate 33 of transistor 34 at node 30. Capacitive means 32 performs a function similar to that performed by capacitive means 17.

An input signal to terminal 20 is then transferred from node 30 to output terminal 35 on the second pulse of voltage phase $\Phi_1$.

Figure 3:
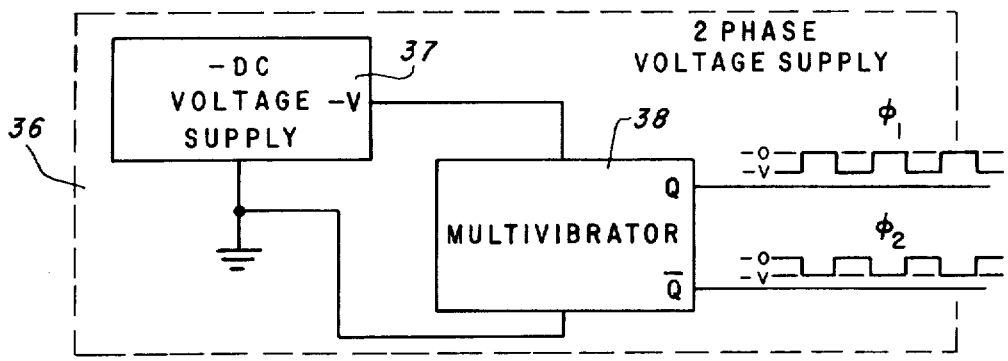
FIG. 3 illustrates means for generating a two phase signal for operating the shift register of FIG. 2.

Several means for producing a two-phase voltage $\Phi_1$ − $\Phi_2$ are available. One such voltage supply is illustrated in FIG. 3. Voltage supply 36 is comprised of DC voltage supply 37 and multivibrator 38. Multivibrator 38 is an oscillator-type circuit providing approximate square wave pulses of two phases from outputs Q and $\overline{Q}$. The voltage generated from output Q can be considered phase $\Phi_1$ and the voltage generated from output $\overline{Q}$ can be considered $\Phi_2$ with pulse voltage levels of −17 to −28 volts.

Figure 4:
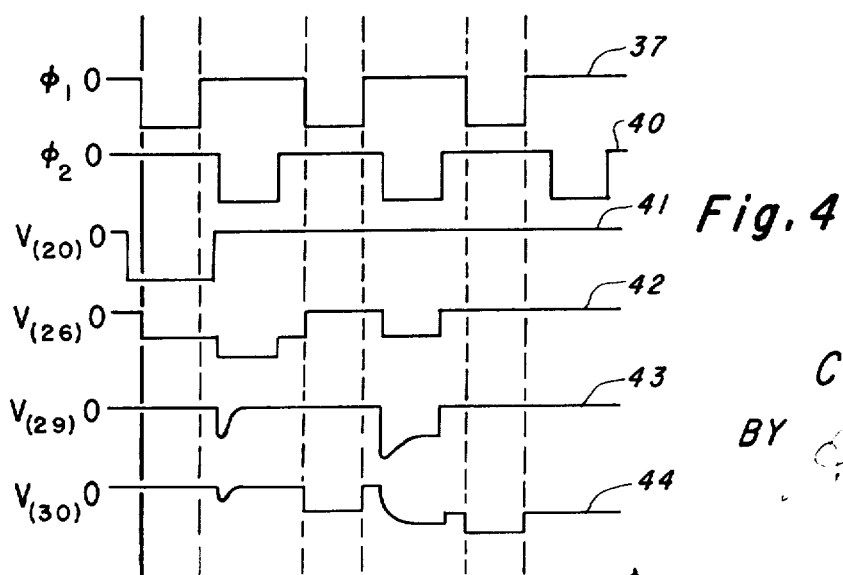
FIG. 4 illustrates the operation of the shift register of FIG. 2 during a plurality of voltage pulses.

An analysis of the one-bit stage of the two-phase shift register of FIG. 2 when the signals provided by two-phase voltage supply 36 of FIG. 3, may be made with reference to the graphs of FIG. 4. The X-axis of the graph is a real-time axis. There are several Y-axes in the graph, each beginning at a zero (0) voltage amplitude level and going into negative voltages for a p-channel embodiment. Graph 39 shows the $\Phi_1$ voltage phase and graph 40 shows the $\Phi_2$ voltage phase being applied to the circuit of FIG. 2. Graph 41 shows the input signal applied to terminal 20 at the time pulses from phases $\Phi_1$ and $\Phi_2$ are operating the circuit. A negative input voltage at terminal 20 represents a binary 1, while a 0 input voltage at terminal 20 represents a binary 0. Graph 42 illustrates the voltage propagation at nodes 26, graph 43 represents the voltage propagation at node 29, and graph 44 represents the voltage propagation at node 30. Notice how, when the third pulse of phase $\Phi_1$ is reached, a binary 1 voltage output appears at node 30 according to graph 44.

Figure 5:
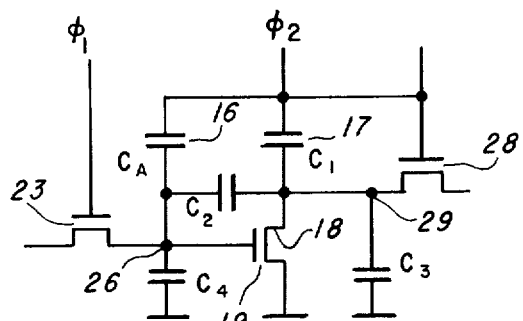
FIGS. 5 and 6 illustrate equivalent circuit diagrams in which all parasitic capacitances in a practical circuit are taken into consideration to calculate the value of the capacitive circuit means.
Figure 6:
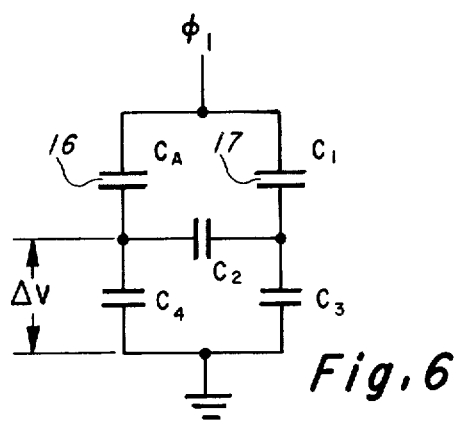

In order to calculate the capacitance of capacitive means 16 for the one-bit shift register stage of FIG. 2 an equivalent circuit analysis is made. Referring then to FIG. 5, capacitive means 16 is referred to as $C_A$. Capacitive means 17 is designated as capacitor $C_1$. Capacitors $C_2$, $C_4$ and $C_3$ are capacitances inherent in the insulated field effect transistor circuit. In the equivalent circuit of FIG. 6, all capacitances, including all parasitic capacitances in a practical circuit have been taken into consideration. The amount of the voltage $\Delta V$ coupled through capacitors to the driver gate can be derived through circuit analysis as follows:

$$\Delta V = \frac{C_1(C_A + C_2 + C_3) + C_A C_2}{(C_A + C_3)(C_1 + C_4) + C_2(C_1 + C_4 + C_2 + C_3)} \Phi_2 \quad (1)$$

where $\Phi_2$ is the voltage amplitude at the critical clock phase. From equation (1), $C_A$ can readily be obtained as a function of $\Delta V$ and the other circuit capacitances. Thus:

$$C_A = \frac{(C_1 C_2 + C_1 C_4 + C_2 C_3 + C_2 C_4 + C_3 C_4)\Delta V - C_1 C_2}{(C_1 + C_2 + C_3)(\Phi_2 - \Delta V)} \Phi_2 \quad (2)$$

Figure 7:
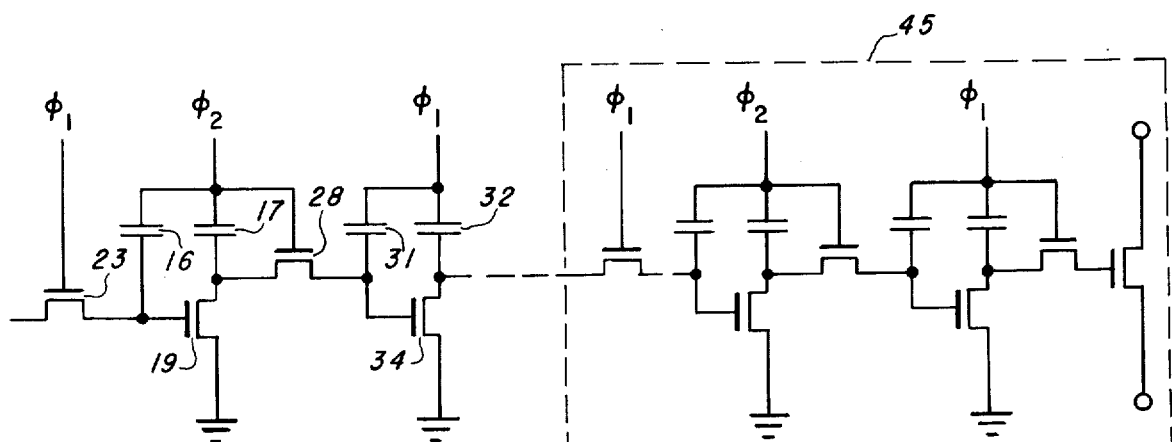
FIG. 7 illustrates an n-bit version of the shift register of FIG. 2.

In FIG. 7, a second stage 45 has been added to the one-bit stage of FIG. 2. As many stages n as desired may be linked together in a chain, as shown, to provide a shift register having n-bit capacity. The size of an internal one-bit cell of the insulated gate field effect transistor embodiment illustrated can be fabricated smaller than 10.5 mils. The power dissipation per bit is less than 50µW at 1MGz, for example, and the minimum input logic 1 level voltage is only −1.0 volts, through the circuit has a built-in threshold voltage of −2.0 volts.

Figure 8:
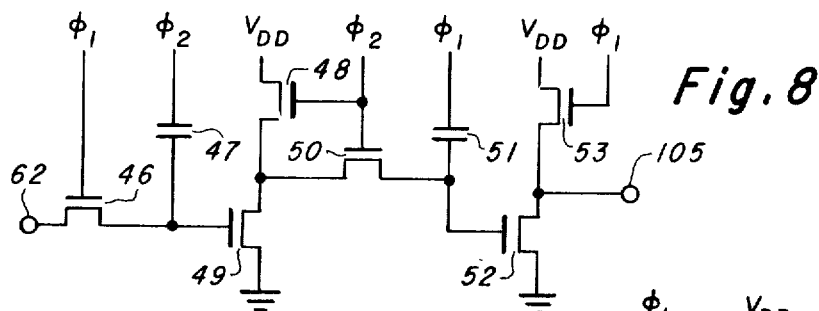
FIGS. 8 and 9 illustrate two phase dynamic ratio type circuit embodiments of the invention.

Other circuits employing the gate coupled capacitive means of the invention are illustrated in FIGS. 8–15. In FIG. 8, for example, a dynamic ratio-type circuit is illustrated in which capacitive means 46 and 51 have been coupled to the driver gates of field effect transistors 49 and 52 respectively. A ratio-type inverter circuit is one in which the load device resistance must be at least 10 times the resistance of the driver. Thus, an input signal applied to terminal 62 is propagated through transistor 46 during a pulse from phase $\Phi_1$. Then, a pulse from voltage phase $\Phi_2$ turns on the gate of transistor 48. The gate of transistor 49 is coupled to capacitive means 47 to overcome the threshold voltage of that transistor and transistor 50 will propagate a binary 0 or 1 to the gate of transistor 52 depending upon the binary signal applied to the gate of transistor 49. A second pulse from voltage phase $\Phi_1$ propagates the binary signals to output terminal 105 while capacitive means 51, coupled to the gate of transistor 52, overcomes the threshold voltage of that transistor.

Figure 9:
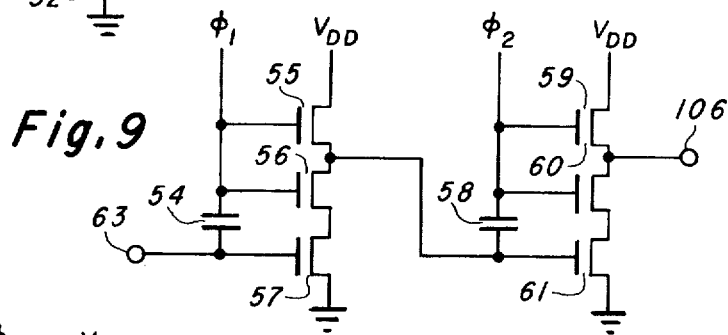

The circuit of FIG. 9 is also a ratio-type circuit in which a binary voltage level signal transmitted to input terminal 63 and utilizes the effect of capacitive means 54 in accordance with the invention to overcome the threshold voltage of transistor 57 when a pulse is applied from voltage phase $\Phi_1$. The binary signal is then propagated through transistors 56 and 55 and applied to the gate of transistor 61. Capacitive means 58 increases the logical signal applied to the gate of transistor 61 during a pulse from voltage phase $\Phi_2$ to overcome the threshold voltage of transistor 61. The logical signal applied to the gate of transistor 61 is thereby propagated through transistor 60 and 59 to output terminal 106. $V_{DD}$ is, for example, −17 to −28 volts.

Figure 10:
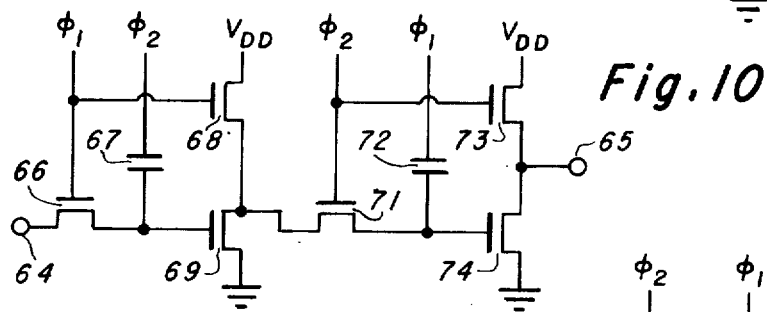
FIGS. 10–12 illustrate two phase dynamic ratioless type circuit embodiments of the invention.

The circuit of FIG. 10 is a ratioless-type dynamic circuit in which the resistance of the driver transistor is not dependent upon the resistance of the load device. In this circuit a signal applied to terminal 64 is propagated through transistor 66 during a pulse from voltage $\Phi_1$ and applied to the gate of transistors 69. A pulse from voltage phase $\Phi_2$ immediately following the pulse from phase $\Phi_1$ is also applied to the gate of transistor 69 by capacitive means 67 to overcome the threshold voltage of that transistor. The binary signal applied to the gate of transistor 69 is thereby propagated by transistors 68, 69 and 71 during the pulse from phase $\Phi_2$. Then, on the next pulse from voltage phase $\Phi_1$, capacitive means 72 coupled to the gate of transistor 74 and voltage phase $\Phi_1$ overcomes the threshold voltage of transistor 74 and allows the binary signal, propagated through transistor 71 during the pulse from voltage phase $\Phi_2$, to be applied to the gate of transistor 75. The binary signal is thereby propagated to output terminal 65.

Figure 11:
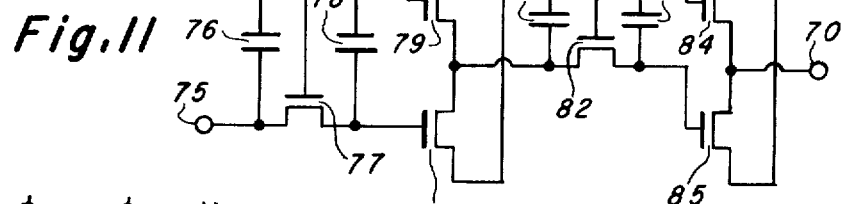

In the ratioless-type dynamic circuit of FIG. 11, a binary signal is applied to terminal 75 and propagated through transistor 77 during a pulse from voltage phase $\Phi_1$. Capacitive means 78 coupled between voltage phase $\phi_2$ and the gate of transistor 80 is utilized to overcome the threshold voltage of transistor 80 in applying the propagated binary signal to the gate of transistor 80. Transistor 79 is utilized as a load resistor. The binary signal applied to the gate of transistor 80 is thus transmitted to the source of transistor 82 during the next pulse from voltage $\Phi_1$ and propagated through transistor 82 during the next pulse from voltage phase $\Phi_2$. The next pulse, which is from phase $\Phi_1$ is added to the binary voltage level output signal from the drain of transistor 82 in applying such binary signal to the gate of transistor 85. The binary signal is then propagated through transistor 85 to output terminal 70 during the next pulse from voltage phase $\Phi_2$. Transistor 84 is also utilized as a load resistance for transistor 85.

Figure 12:
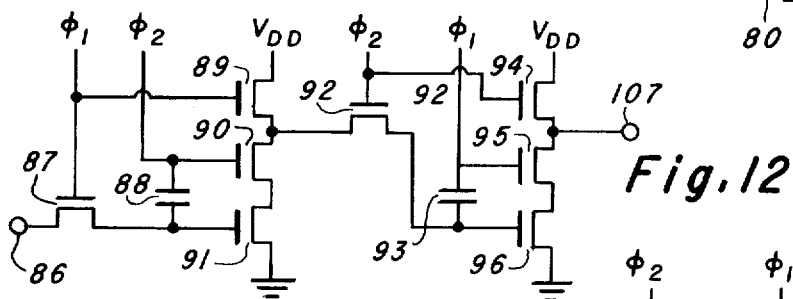

Another taiolerr-type dynamic two-phase circuit is illustrated in FIG. 12. In this circuit a binary voltage level signal applied to terminal 86 is propagated through transistor 87 during a pulse from voltage phase $\Phi_1$ and applied to the gate of transistor 91. The following pulse from voltage phase $\Phi_2$ is added to the binary signal applied to the gate of transistor 91 by capacitive means 88 coupled between voltage phase $\Phi_2$ and the gate of transistor 91. Similarly, the logical signal propagated through transistor 92 during a pulse from voltage phase $\Phi_2$ is applied to the gate of transistor 96 and a next pulse from voltage phase $\Phi_1$ is added to the binary signal applied to the gate of transistor 96 by capacitive means 93 coupled between the gate of transistor 96 and voltage phase $\Phi_1$. The binary signal is thereby propagated to output terminal 107.

Figure 13:
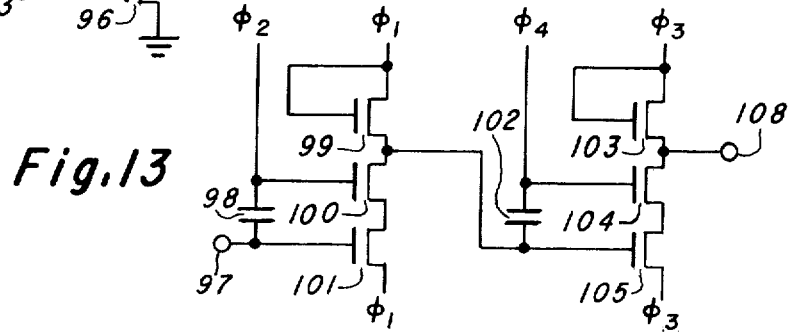
FIG. 13 illustrates a 4-phase dynamic circuit embodiment of the invention.

A four phase dynamic circuit, illustrated in FIG. 13, utilizes capacitive means 98 coupled between the gate of driver transistor 101 and voltage phase $\Phi_2$ to overcome the threshold voltage of transistor 101 when a binary voltage level signal is applied to input terminal 97. In a similar manner capacitive means 102 is coupled between the gate of driver transistor 15 to overcome the threshold voltage of transistor 105 to overcome the threshold voltage of transistor 105 when a binary level voltage signal is transmitted from the drain of transistor 100 to the gate of transistor 105. Transistors 99 and 103 are connected gate to drain for utilization as load resistors. The binary signal is transmitted from transistor 104 to output terminal 108 during a pulse from voltage phase $\Phi_4$ in the four phase system.

Figure 14:
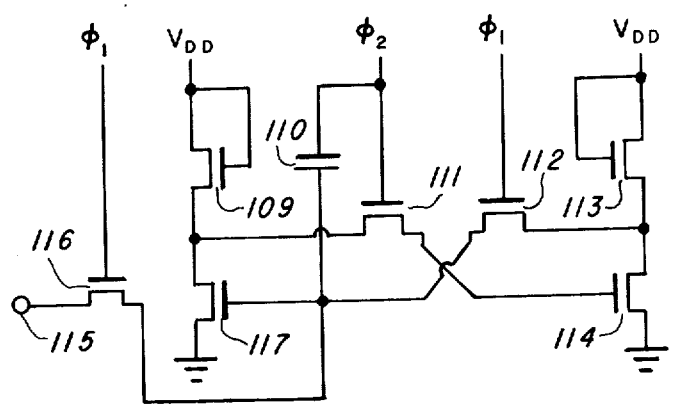
FIG. 14 illustrates a static shift register embodiment of the invention.

A static shift register embodiment of the circuit is illustrated in FIG. 14. The static shift register, unlike the dynamic circuits illustrated above with reference to FIGS. 2 and 7-13, can retain a piece of binary data in a single cell indefinitely. In the illustrated embodiment, a binary voltage level signal is applied to terminal 115 and thereby propagated through transistor phase $\Phi_1$. The binary data is then applied to the gate of transistor 117 during a pulse from voltage phase $\Phi_2$. Capacitive means 109, coupled between the gate of transistor 117 and voltage phase $\Phi_2$, is utilized to overcome the threshold voltage of transistor 117. The binary data is held in transistors 117 and 114 by transistors 112 and 111 respectively. Transistors 109 and 113 are gate-to-drain coupled and act as resistive loads for transistors 117 and 144 respectively.

Figure 15:
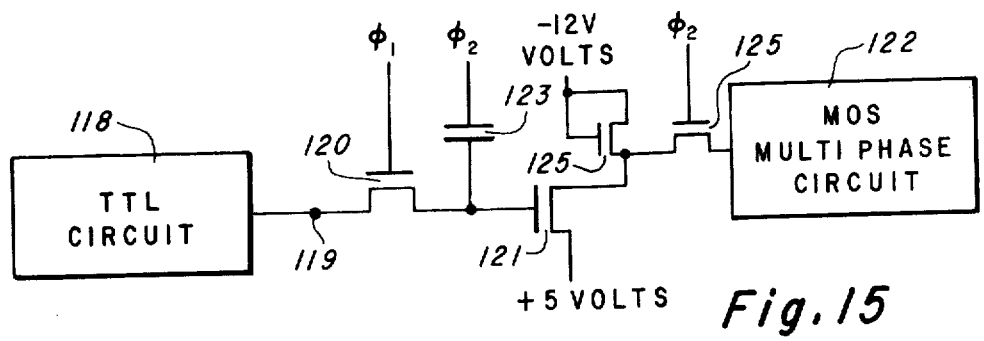
FIG. 15 illustrates the dynamic circuit means of the present invention utilized to interface the output of a bipolar transistor to the driver-gate input of an insulated gate field effect transistor.

As previously mentioned, the capacitive means of the invention may be employed in coupling a transistor-transistor logic circuit (TTL) to an insulated gate field effect transistor circuit (MOS or MIS, for example). As illustrated in FIG. 15, TTL circuit 118 provides a binary voltage level output at terminal 119. Typically, this output is ± 0.5 volts for a binary 0 and +3.0 volts for a binary 1. During a pulse from voltage phase $\Phi_1$, the binary signal is propagated through transistor 120. The source of transistor 121 is connected to a +5 volt DC supply and the drain is coupled to a −12 volt DC supply by resistor 124. The effective signal applied to the gate of driver transistor 121 is then −4.5 volts when the TTL output is a binary 0 (+0.5). Capacitive means 123 is utilized to overcome the threshold voltage of transistor 121. Transistor 125 is a load transistor.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention, will, without departing from the spirit and scope of the invention, be apparent to persons skilled in the art.

What is claimed is:

1. A method for reducing the effect of excessive threshold voltages in field effect transistor logic circuits having a multiphase voltage supply, said method comprising the steps of:
   a. coupling one side of a capacitor to the gate of a field effect transistor in said circuit,
   b. providing low level data signals to the gate of said field effect transistor, at least some of said data signals having a magnitude less than the threshold voltage of said transistor, and
   c. coupling the other side of said capacitor to said multiphase voltage supply and clocking the other side of said capacitor with said data, whereby the combined effect of said data signals and said multiphase voltage supply coupled through said capacitor cause said field effect transistor to change state.

2. The method according to claim 1, wherein said field effect transistor is caused to change from a nonconducting mode to a conducting mode in response to the combined action of said data signals and said multiphase voltage supply coupled through said capacitor.

3. The method according to claim 1, wherein said multiphase voltage supply is a two phase clock signal and wherein said data is clocked by one phase of said two phase clock signal and said capacitor is clocked by the other phase of said clock signal.

* * * * *